United States Patent
Lin et al.

(10) Patent No.: US 12,328,827 B2
(45) Date of Patent: Jun. 10, 2025

(54) PROTECTING METHOD FOR PREVENTING SOLDER CRACK FAILURE IN ELECTRONIC PRODUCT

(71) Applicant: SOLID STATE STORAGE TECHNOLOGY CORPORATION, Taipei (TW)

(72) Inventors: Tsung-Lung Lin, Taipei (TW); Kuan-Yu Chen, Taipei (TW); Yi-Chun Huang, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 389 days.

(21) Appl. No.: 18/077,255

(22) Filed: Dec. 8, 2022

(65) Prior Publication Data

US 2024/0114631 A1 Apr. 4, 2024

(30) Foreign Application Priority Data

Sep. 29, 2022 (CN) .......................... 202211204201.4

(51) Int. Cl.
H05K 3/34 (2006.01)
G01R 31/28 (2006.01)

(52) U.S. Cl.
CPC ....... *H05K 3/3463* (2013.01); *G01R 31/2855* (2013.01); *G01R 31/2874* (2013.01); *G01R 31/2875* (2013.01); *G01R 31/2877* (2013.01)

(58) Field of Classification Search
CPC ..................................................... H05K 3/3463
See application file for complete search history.

(56) References Cited

U.S. PATENT DOCUMENTS

| 2006/0179334 | A1* | 8/2006 | Brittain | .................... | G06F 1/206 |
| | | | | | 713/320 |
| 2012/0198293 | A1* | 8/2012 | Mukai | .................... | H05K 3/341 |
| | | | | | 714/E11.159 |
| 2022/0301598 | A1* | 9/2022 | Eemani | .................... | G11C 7/04 |

FOREIGN PATENT DOCUMENTS

JP 2016100361 A * 5/2016

* cited by examiner

*Primary Examiner* — Herbert K Roberts
(74) *Attorney, Agent, or Firm* — WPAT, PC

(57) ABSTRACT

A protecting method for preventing solder crack failure in an electronic product is provided. Firstly, a step (a) is performed to confirm that a crack incidence rate of a metallic solder material in a printed circuit board is high. In a step (b), a protecting mechanism of controlling the electronic product to enter an idle mode and leave the idle mode is activated. Consequently, an operating temperature of the electronic product decreases at a first average drop rate.

10 Claims, 3 Drawing Sheets

PROTECTING METHOD FOR PREVENTING SOLDER CRACK FAILURE IN ELECTRONIC PRODUCT

This application claims the benefit of People's Republic of China application Serial No. 202211204201.4, filed Sep. 29, 2022, the subject matter of which is incorporated herein by reference.

FIELD OF THE INVENTION

The present invention relates to a protecting method for an electronic product, and more particularly to a protecting method for preventing solder crack failure in an electronic product.

BACKGROUND OF THE INVENTION

As is well known, each electronic product comprises a printed circuit board (PCB). Moreover, various electronic components and IC chips are soldered on the printed circuit board. The electronic components, the IC chips and the printed circuit board are assembled as an electronic product with specific functions. For example, a solid state device (SSD) is one of the electronic products. The solid state device at least comprises a controller, a memory chip and an interface circuit element. After these electronic components are soldered on the printed circuit board and electrically connected with each other, the controller can control the memory chip and the interface circuit element normally. Consequently, the solid state device can be operated normally.

Generally, in the event of solder crack failure, the metallic solder on the printed circuit board is cracked or subjected to deformation. Under this circumstance, at least one signal line between the electronic components cannot be electrically connected with each other, or a short circuit between two signal lines is generated. Consequently, the electronic product cannot be operated normally. In other to judge whether the solder crack failure is generated, a series of PCB reliability tests are performed after the electronic components are soldered on the printed circuit board. Moreover, the metallic solder material is a solder ball (e.g., tin ball).

The solder crack failure is possibly caused by the mechanical stress. For example, the PCB assembly warpage caused by the mechanical stress. During the process of soldering the electronic components on the printed circuit board, if the applied stress is too large and exceeds the stress that the printed circuit board can withstand, the PCB assembly warpage problem is possibly generated. According to the type of the displacement between the printed circuit board and the electronic components, the PCB assembly warpage can be determined as a convex PCB assembly warpage or a concave PCB assembly warpage.

FIG. 1A schematically illustrates the influence of a convex PCB assembly warpage of a printed circuit board. The convex PCB assembly warpage as shown in FIG. 1A is a positive curvature PCB assembly warpage. When the electronic component 102 is soldered on the circuit board 104, the solder balls 106 of the electronic component 102 and the layout trace on the printed circuit board 104 are electrically connected with each other. If the mechanical stress causes the continuous displacement between the printed circuit board 104 and the electronic component 102, a collapse problem is possibly generated. Due to the collapse problem, the solder ball 106s in the middle region of the electronic component 102 are in a short-circuited condition. Consequently, the electronic product cannot be operated normally. Moreover, since the mechanical stress causes the continuous displacement between the printed circuit board 104 and the electronic component 102, the solder balls 106d on the outer region of the electronic component 102 are in an open-circuit condition. Consequently, the electronic product cannot be operated normally.

FIG. 1B schematically illustrates the influence of a concave PCB assembly warpage of a printed circuit board. The concave PCB assembly warpage as shown in FIG. 1B is the negative curvature PCB assembly warpage. When the electronic component 112 is soldered on the circuit board 114, the solder balls 116 of the electronic component 112 and the layout trace on the printed circuit board 114 are electrically connected with each other. If the mechanical stress causes the continuous displacement between the printed circuit board 114 and the electronic component 112, a collapse problem is possibly generated. Due to the collapse problem, the solder ball 116s in the outer region of the electronic component 102 are in a short-circuited condition. Consequently, the electronic product cannot be operated normally.

Moreover, during the screwing assembly process of the electronic product, the solder crack failure is possibly generated. For example, if the printed circuit board is tightly tightened in the casing of the electronic product, a bending force is generated. Due to the bending force, the printed circuit board is bent, and the solder crack failure is generated.

Moreover, the electronic product is possibly subjected to shock or vibration. For example, if the electronic component is subjected to shock or vibration during the shipping process, the solder crack failure is possibly generated. Consequently, the electronic component and the printed circuit board within the electronic product cannot be electrically connected with each other.

Moreover, the solder crack failure may be caused by both of the thermal stress and the mechanical stress. For example, if the electronic product is operated in the environment with drastic changes between high and low temperatures (e.g., $-40°$ C.$\sim$$85°$ C.), the convex PCB assembly warpage and the concave PCB assembly warpage are alternately generated because of the high and low temperature changes. Under this circumstance, the solder balls are readily aged or cracked. Consequently, the solder crack failure is generated.

For solving the above problems, the manufacturer performs a series of temperature cycle tests (also referred as TCT tests) after the electronic product is assembled and before the electronic product leaves the factory. The electronic product passing the tests can be introduced into the market and used by end user. However, after the electronic product is delivered from the manufacturer to the user, the manufacturer is unable to know the operating environment of the user. If the operating environment of the user is harsh, the electronic product is likely to suffer from both of the mechanical stress and the thermal stress. Under this circumstance, the electronic components and the printed circuit board within the electronic product are possibly subjected to the solder crack failure. Consequently, the electronic product is possibly damaged and unable to be operated normally.

SUMMARY OF THE INVENTION

An embodiment of the present invention provides a protecting method for preventing solder crack failure in an electronic product. Firstly, a step (a) is performed to confirm that a crack incidence rate of a metallic solder material in a printed circuit board is high. In a step (b), a protecting mechanism of controlling the electronic product to enter an idle mode and leave the idle mode is activated. Consequently, an operating temperature of the electronic product decreases at a first average drop rate.

Another embodiment of the present invention provides a protecting method for preventing solder crack failure in a solid state device. The solid state device includes a circuit board, a controller and plural non-volatile memory chips. The controller and the plural non-volatile memory chips being soldered on plural layout traces of the printed circuit board through a metallic solder material. The controller is electrically connected with the plural non-volatile memory chips. The protecting method includes the following steps. Firstly, it is confirmed that a crack incidence rate of a metallic solder material in a printed circuit board is high. Then, a protecting mechanism is activated. when an operating temperature of the solid state device reaches a first operating temperature, the controller controls a number of times of allowing the solid state device to enter an idle mode and controls a time length in the idle mode. Consequently, the operating temperature of the solid state device is decreased at a first average drop rate.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a protecting method for preventing solder crack failure in an electronic product. After the electronic product leaves the factory and the electronic product is delivered to the user, the internal circuit of the electronic product will activate a protecting mechanism at the appropriate time to avoid the solder crack failure. Consequently, the electronic product can be operated normally. As mentioned above, if the electronic product is operated in the environment with drastic changes between high and low temperatures (e.g., −40° C.~85° C.), the solder balls are readily aged or cracked, and the solder crack failure is generated. Especially, the protecting mechanism of the present invention can effectively reduce the influence of the drastic changes between high and low temperatures.

Figure 1A:
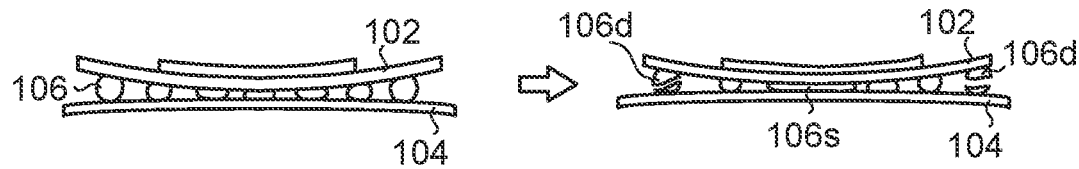
FIG. 1A (prior art) schematically illustrates the influence of a convex PCB assembly warpage of a printed circuit board.
Figure 1B:
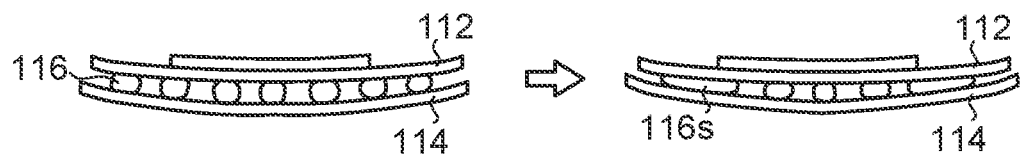
FIG. 1B (prior art) schematically illustrates the influence of a concave PCB assembly warpage of a printed circuit board.
Figure 2:
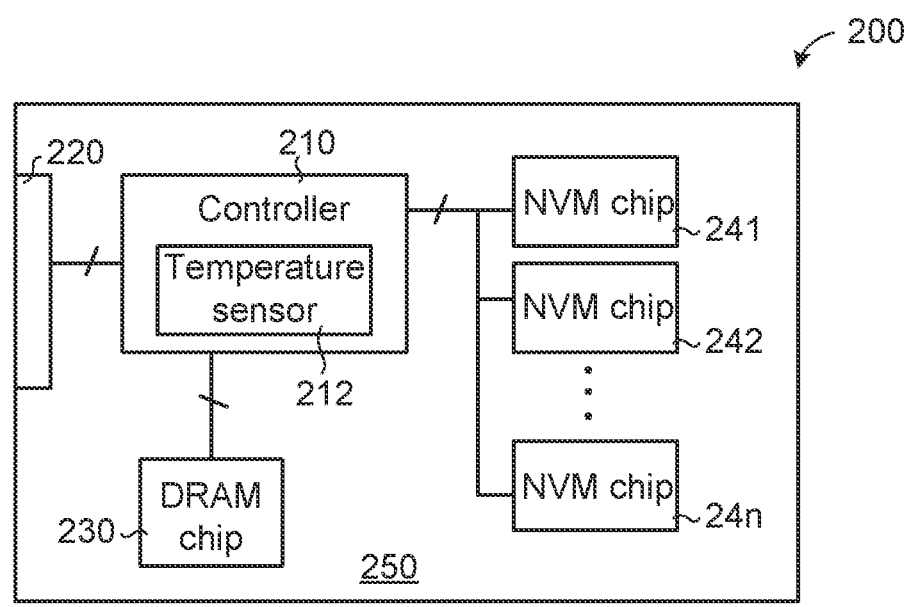
FIG. 2 is a schematic functional block diagram illustrating an electronic product according to an embodiment of the present invention.

FIG. 2 is a schematic functional block diagram illustrating an electronic product according to an embodiment of the present invention. For example, the electronic product is a solid state device (SSD) 200. The solid state device 200 comprises a circuit board 250, a controller 210, a volatile memory chip 230, plural non-volatile memory chips (also referred as NVM chips or NVM ICs) 241~24n and an interface circuit element 220. For example, the volatile memory chip 230 is a DRAM chip, SRAM chip or the like. In the following embodiments, the DRAM chip will be taken as an example of the volatile memory chip 230.

The controller 210, the DRAM chip 230, the non-volatile memory chips 241~24n and the interface circuit element 220 are soldered on the layout traces of the printed circuit board through the metallic solder material. Consequently, the controller 210 is electrically connected with the DRAM chip 230, the non-volatile memory chips 241~24n and the interface circuit element 220. In an embodiment, the interface circuit element 220 is an M.2 interface circuit element. The interface circuit element 220 is electrically connected with a host (not shown). In other word, the solid state device 200 can receive access commands from the host and store the write data from the host according to the M.2 specification. Moreover, the read data in the solid state device 200 can be transmitted to the host.

In an embodiment, the controller 210 comprises at least one temperature sensor 212. The temperature sensor 21 is used to detect the operating temperature of the solid state device 200. In another embodiment, the temperature sensor 212 is installed outside the controller 210, and the temperature sensor 212 is electrically connected with the controller 210. In some other embodiments, the at least one temperature sensor 212 is included in the DRAM chip 230 and/or the non-volatile memory chips 241~24n. It is noted that the installation position and the number of the at least one temperature sensor 212 are not restricted.

The controller 210 receives at least one temperature signal from the at least one temperature sensor 212. According to the at least one temperature signal, the controller 210 acquires the operating temperature of the solid state device 200. The controller 210 calculates the crack incidence rate of the metallic solder material in the circuit board 250 according to the operating temperature. Moreover, if the controller 210 judges that the crack incidence rate of the metallic solder material is high, the controller 210 activates the protecting mechanism. The operations of the protecting method will be described as follows.

For example, the ambient temperature of the solid state device 200 is 25° C. when the solid state device 200 is not used. When the solid state device 200 receives the electric power and starts up, the operating temperature received by the controller 210 is equal to the ambient temperature. Meanwhile, the operating temperature of the solid state device 200 is the lowest operating temperature (i.e., approximatively equal to 25° C.).

After the host accesses data of the solid state device 200, the operating temperature of the solid state device 200 starts to increase. For example, in case that the host has accessed the data of the solid state device 200 for a long time, the controller 210 is continuously in the normal working state. Consequently, the operating temperature of the solid state device 200 continuously increases and reaches the highest operating temperature.

Moreover, when the host stops accessing data of the solid state device 200, the controller 210 is operated in an idle state. Consequently, the operating temperature of the solid state device 200 decreases. However, if the operating temperature of the solid state device 200 decreases from the highest value to the lowest value because the host stops accessing or the controller 210 is in the idle state, the drop rate of the operating temperature is too fast. Consequently, the operating temperature of the solid state device 200 is dramatically changed between the high and low temperature.

Figure 3:
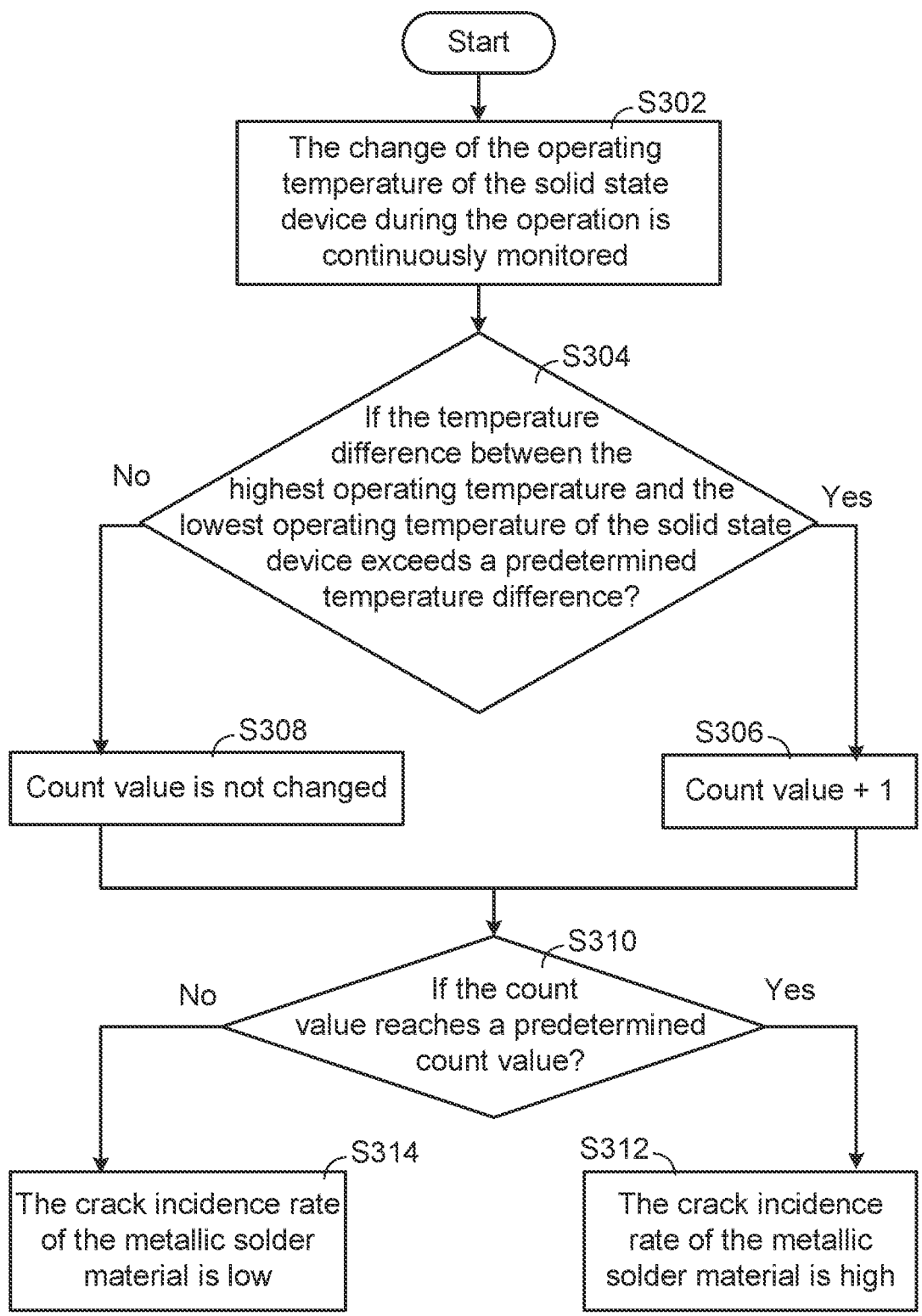
FIG. 3 is a flowchart illustrating a method of judging whether a protecting mechanism needs to be activated.

FIG. 3 is a flowchart illustrating a method of judging whether a protecting mechanism needs to be activated. After the solid state device 200 receive the electric power and starts up, the controller 210 continuously monitors the change of the operating temperature of the solid state device 200 during the operation (Step S302). Then, a step S304 is performed to judge whether the temperature difference between the highest operating temperature and the lowest operating temperature of the solid state device 200 exceeds a predetermined temperature difference. If the judging condition of the step S304 is satisfied, the controller 210 increases a count value by 1 (Step 306). For example, the predetermined temperature difference is 60° C. If the temperature difference between the highest operating temperature and the lowest operating temperature exceeds 60° C., the controller 210 increases the count value by 1.

On the other hand, if the judging result of the step S304 indicates that the temperature difference between the highest operating temperature and the lowest operating temperature of the solid state device 200 during the operation does not exceed the predetermined temperature difference (e.g., 60° C.), the count value is kept unchanged by the controller 210 (Step S308). Moreover, the count value is still retained after the solid state device 200 is powered off. For example, the count value is stored in the NVM chip 241 of the solid state device 200. In case that the solid state device 200 comprises plural temperature sensors 212, the controller 210 detects the operating temperatures from the plural temperature sensors 212 and generates and stores the corresponding count values.

Then, a step S310 is performed to judge whether the count value reaches a predetermined count value. If the judging condition of the step S310 is satisfied, it means that the number of times the solid state storage device 200 undergoes the drastic changes between high and low operating temperatures exceeds an allowable range. Under this circumstance, the controller 210 judges that the crack incidence rate of the metallic solder material in the printed circuit board 250 is high (Step S312). Whereas, if the judging condition of the step S310 is not satisfied, the controller 210 judges that the crack incidence rate of the metallic solder material in the printed circuit board 250 is low (Step S314). If the solid state device 200 comprises plural temperature sensors 212 and one of the plural temperature sensors 212 detects that the count value reaches the predetermined count value in the step S310, the controller 210 judges that the crack incidence rate of the metallic solder material in the printed circuit board 250 is high (Step S312).

As mentioned above, the crack incidence rate of the metallic solder material in the printed circuit board 250 is judged according to the count value calculated by the controller 210. For example, the predetermined count is 4500. If the count value reaches 4500, it means that the solid state device 200 has been operated in the environment with the temperature difference higher than 60° C. for 4500 times after the solid state device 200 leaves the factory. Under this circumstance, the controller 210 of the solid state device 200 judges that the crack incidence rate of the metallic solder material in the printed circuit board 250 is high. If the solid state device 200 is continuously operated in the environment undergoing the drastic changes between high and low temperatures, the metallic solder material is possibly cracked or the crack condition is serious. Under this circumstance, the solder crack failure is generated.

In the above embodiment, the predetermined temperature difference is 60° C., and the predetermined count value is 4500. It is noted that the predetermined temperature difference and the predetermined count value are not restricted. In some embodiments, before the electronic product leaves the factory, a series of temperature cycle tests (also referred as TCT tests) are performed, and the predetermined temperature difference and the predetermined count value are determined according to the results of the TCT tests. For example, in another embodiment, the predetermined temperature difference is 45° C., and the predetermined count value is 7000. If the solid state device 200 has been operated in the environment with the temperature difference higher than 45° C. for 7000 times, the controller 210 judges that the crack incidence rate of the metallic solder material in the printed circuit board 250 is high.

Moreover, if the controller 210 judges that the crack incidence rate of the metallic solder material in the printed circuit board 250 is high, the controller 210 activates the protecting mechanism. In an embodiment of the protecting mechanism, during the operation of the solid state device 200, the controller 210 controls the drop rate of the operating temperature at the appropriate time in order to prevent the cracking condition of the metallic solder material or slow down the cracking condition of the metallic solder material.

In another embodiment of the protecting mechanism, the controller 210 issues a warning signal to the host through the interface circuit element 220 in order to notify the host that the crack incidence rate of the metallic solder material in the printed circuit board 250 is high. After receiving the warning signal, the host changes the speed of accessing the solid state device in order to prevent the cracking condition of the metallic solder material or slow down the cracking condition of the metallic solder material.

Figure 4:
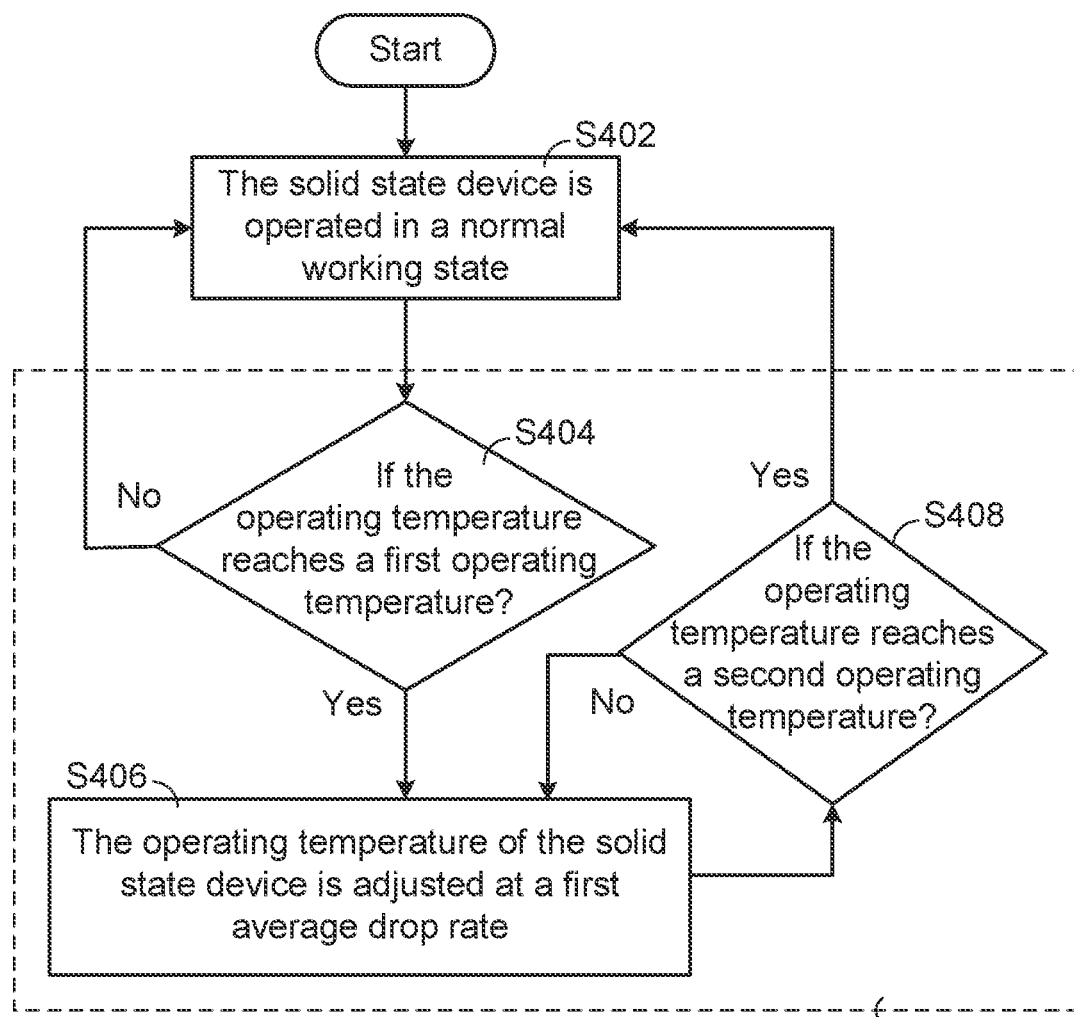
FIG. 4 is a flowchart illustrating the operations of the protecting mechanism for the solid state device according to an embodiment of the present invention.

FIG. 4 is a flowchart illustrating the operations of the protecting mechanism for the solid state device according to an embodiment of the present invention. After solid state device 200 receives the electric power and starts up, the solid state device 200 is operated in a normal working state (Step S402). Meanwhile, the host issues an access command to access the data of the solid state device 200. In other words, if the host continuously issues the access command, the solid state device 200 is continuously in the normal working state (Step S402). Moreover, if the host continuously accesses the data of the solid state device 200, the operating temperature of the solid state device 20 continuously increases.

Please also refer the flowchart of FIG. 3. If the controller 210 judges that the crack incidence rate of the metallic solder material in the printed circuit board 250 is low (e.g., the count value does not exceed the predetermined value), the solid state device 200 is maintained in the normal working state (Step S402). Under this circumstance, the protecting mechanism 400 is not activated, and the controller 210 continuously judges whether the protecting mechanism 400 needs to be activated.

If the controller 210 judges that the crack incidence rate of the metallic solder material in the printed circuit board 250 is high (i.e., the count value reaches the predetermined value), the protecting mechanism as shown in FIG. 4 is activated by the controller 210.

When the protecting mechanism 400 is activated and the solid state device 200 is in the normal working state, the controller 210 judges whether the operating temperature reaches a first operating temperature (Step S404). If the judging condition of the step S404 is not satisfied, the solid state device 200 is maintained in the normal working state. Whereas, if the judging condition of the step S404 is satisfied, the operating temperature of the solid state device 200 is adjusted at a first average drop rate under control of the controller 210 (Step S406). Consequently, the operating temperature of the solid state device 200 gradually decreases. Since the operating temperature of the solid state device 200 is adjusted at the first average drop rate, the operating temperature of the solid state device 200 will not drop dramatically. Consequently, the problem of accelerating the cracking condition of the metallic solder material is prevented. If the solid state device 200 comprises plural temperature sensors 212 and one of the plural temperature sensors 212 detects that the operating temperature reaches the first operating temperature in the step S404, the subsequent steps S406 and S408 of the protecting mechanism are performed. For example, in the step S406, the operating temperature of the solid state device 200 is adjusted at the first average drop rate under control of the controller 210.

While the operating temperature of the solid state device 200 is adjusted at the first average drop rate, the controller 210 judges whether the operating temperature reaches a second operating temperature (Step S408). The second operating temperature is lower than the first operating temperature. If the judging condition of the step S408 is satisfied, the solid state device 200 is restored to the normal working state (Step S402). Whereas, if the judging condition of the step S408 is not satisfied, the step S406 is repeatedly done. That is, the operating temperature of the solid state device 200 is adjusted at the first average drop rate under control of the controller 210.

In an embodiment, the first operating temperature and the second operating temperature are previously set before the solid state device 200 leaves the factory. Alternatively, after the solid state device 200 leaves the factory, the first operating temperature and the second operating temperature are set according to the practical operating temperature of the solid state device 200. In an embodiment, the first operating temperature in the step S404 of the protecting mechanism 400 and the second operating temperature in the step S408 of the protecting mechanism 400 are respectively set as the highest operating temperature and the lowest operating temperature in the step S304 of FIG. 3.

When the host continuously accesses the data of the solid state device 200 and the operating temperature reaches the first operating temperature, the controller 210 activates the protecting mechanism 400. The controller 210 adjusts the operating temperature by entering and leaving the idle mode for many times, so that the operating temperature of the solid state device 200 decreases at the first average drop rate. Generally, when the controller 210 enters the idle mode, the controller 210 stops accessing data. Consequently, the operating temperature of the solid state device 200 decreases. When the controller 210 leaves the idle mode, the controller 210 accesses data again. Consequently, the operating temperature of the solid state device 200 increases. In other words, by adjusting the frequency of allowing the controller 210 to enter the idle mode, the drop rate of the operating temperature can be controlled accordingly.

Figure 5:
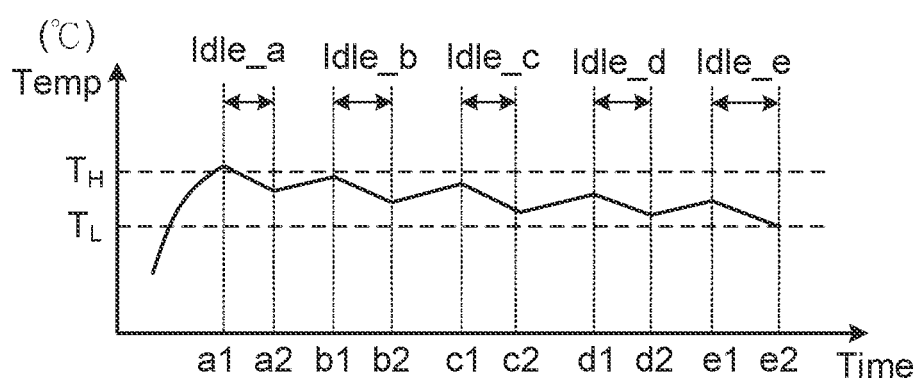
FIG. 5 is a schematic timing diagram illustrating the method of adjusting the operating temperature of the solid state device by the controller.

FIG. 5 is a schematic timing diagram illustrating the method of adjusting the operating temperature of the solid state device by the controller. When the protecting mechanism 400 is activated, the controller 210 judges whether the operating temperature reaches the first operating temperature (Step S404). Before the time point a1, the host accesses the data of the solid state device 200. Since the controller 210 of the solid state device 200 is continuously operated in the normal working state, the operating temperature increases and exceeds a high threshold temperature value TH (e.g., 85° C.).

At the time point a1, the operating temperature of the solid state device 200 is adjusted at the first average drop rate under control of the controller 210 (Step S406). Then, the solid state device 200 enters the idle mode Idle_a under control of the controller 210. In the idle mode Idle_a, the controller 210 stops accessing data, and thus the operating temperature of the solid state device 200 decreases. At the time point a2, the solid state device 200 leaves the idle mode Idle_a.

After the solid state device 200 leaves the idle mode Idle_a, the controller 210 accesses the data of the solid state device 200 again. Consequently, the operating temperature of the solid state device 200 increases.

At the time point 131, the solid state device 200 enters the idle mode Idle_b again under control of the controller 210. In the idle mode Idle_b, the controller 210 stops accessing data, and thus the operating temperature of the solid state device 200 decreases again. At the time point b2, the solid state device 200 leaves the idle mode Idle_b again. The above procedures are repeatedly done. Consequently, the operating temperature of the solid state device 200 is adjusted at the first average drop rate under control of the controller 210.

As shown in FIG. 5, the controller 210 enters the idle modes Idle_a, Idle_b, Idle_c, Idle_d and Idl_e at the time points a1, b1, c1, d1 and e1, respectively. Moreover, the controller 210 leaves the idle modes Idle_a, Idle_b, Idle_c, Idle_d and Idl_e at the time points a2, b2, c2, d2 and e2, respectively. By controlling the number of times of entering the idle mode and the time length of the idle mode (i.e., the time interval a1-a2, the time interval b1-b2, the time interval c1-c2 and the time interval d1-d2), the drop rate of the operating temperature of the solid state device 200 is controlled by the controller 210. For example, the solid state device 200 is cooled down at an average drop rate of 3° C. per minute (−3° C./min) by the controller 210.

At the time point e1, the solid state device 200 enters the idle mode Idle_e under control of the controller 210. At the time point e2, the controller 210 confirms that the operating temperature reaches a low threshold temperature value $T_L$ (e.g., 45° C.). That is, the operating temperature reaches the second operating temperature (Step S408). Consequently, the controller 210 stops adjusting the operating temperature of the solid state device 200 at the first average drop rate, and the solid state device 200 is operated in the normal working state under control of the controller 210 (Step S402). Similarly, the controller 210 continuously judges whether the operating temperature reaches the first operating temperature (Step S404).

As mentioned above, by controlling the number of times of entering the idle mode and the time length of the idle mode, the solid state device 200 is controlled to be cooled down at the average drop rate of 3° C. per minute (−3° C./min) within the temperature range between the high threshold temperature value T H and the low threshold temperature value $T_L$.

In an embodiment, plural threshold temperature values and plural average drop rate are set by the controller 210. For example, the first threshold temperature value is set as 85° C., the second threshold temperature value is set as 60° C., and the third threshold temperature value is set as 45° C. The solid state device 200 is controlled to be cooled down at the average drop rate of 3° C. per minute (−3° C./min) within the temperature range between the first threshold temperature value (85° C.) and the second threshold temperature value (60° C.). In addition, the solid state device 200 is controlled to be cooled down at the average drop rate of 5° C. per minute (−5° C./min) within the temperature range between the second threshold temperature value (60° C.) and the third threshold temperature value (45° C.).

From the above descriptions, the present invention provides a protecting method for preventing solder crack failure in an electronic product. When the controller 210 judges that the crack incidence rate of the metallic solder material in the electronic product is high, the protecting mechanism is activated. By properly controlling the timing of entering the idle mode and the timing of leaving the idle mode, the operating temperature of the electronic product is adjusted at the predetermined average drop rate under control of the controller 210. Since the electronic product is not operated in environments with drastic changes between high and low temperatures, the cracking problem of the metallic solder material is largely reduced. Consequently, the use life of the electronic product is extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A protecting method for preventing solder crack failure in an electronic product, the protecting method comprising steps of:
    (a) confirming that a crack incidence rate of a metallic solder material in a printed circuit board is high; and
    (b) activating a protecting mechanism of controlling the electronic product to enter and leave an idle mode multiple times, so that an operating temperature of the electronic product decreases at a first average drop rate.

2. The protecting method as claimed in claim 1, wherein the electronic product is a solid state device, and the solid state device comprises a circuit board, a controller, an interface circuit element, a volatile memory chip and plural non-volatile memory chips, wherein the controller, the volatile memory chip, the plural non-volatile memory chips and the interface circuit element are soldered on plural layout traces of the printed circuit board through the metallic solder material, so that the controller is electrically connected with the volatile memory chip, the plural non-volatile memory chips and the interface circuit element, wherein the interface circuit element is electrically connected with a host.

3. The protecting method as claimed in claim 2, wherein the electronic product further comprises at least one temperature sensor that provides a temperature signal to the controller, wherein the controller acquires the operating temperature of the solid state device according to the temperature signal.

4. The protecting method as claimed in claim 2, wherein the step (a) comprises steps of:
    (a1) continuously monitoring a change of the operating temperature of the solid state device during operation;
    (a2) if a temperature difference between a highest operating temperature and a lowest operating temperature of the solid state device exceeds a predetermined temperature difference, increasing a count value by 1;
    (a3) if the temperature difference between the highest operating temperature and the lowest operating temperature of the solid state device does not exceed the predetermined temperature difference, keeping the count value unchanged; and
    (a4) when the count value reaches a predetermined count value, confirming that the crack incidence rate of the metallic solder material in the printed circuit board is high.

5. The protecting method as claimed in claim 2, wherein when the controller confirms that the crack incidence rate of the metallic solder material in the printed circuit board is high, the controller issues a warning signal to the host through the interface circuit element.

6. The protecting method as claimed in claim 2, wherein the step (b) comprises steps of:
    (b1) continuously monitoring a change of the operating temperature of the solid state device during operation; and
    (b2) when the operating temperature of the solid state device reaches a first operating temperature, decreasing the operating temperature of the solid state device at the first average drop rate within a first temperature range between a first threshold temperature value and a second threshold temperature value.

7. The protecting method as claimed in claim 6, wherein the step (b) further comprises a step (b3) of decreasing the operating temperature of the solid state device at a second average drop rate within a second temperature range between the second threshold temperature value and a third threshold temperature value.

8. The protecting method as claimed in claim 2, wherein a number of times that the solid state device enters the idle mode and a time length in the idle mode are controlled by the controller, so that the operating temperature of the solid state device is decreased at the first average drop rate.

9. A protecting method for preventing solder crack failure in a solid state device, the solid state device comprising a circuit board, a controller and plural non-volatile memory chips, the controller and the plural non-volatile memory chips being soldered on plural layout traces of the printed circuit board through a metallic solder material, the controller being electrically connected with the plural non-volatile memory chips, the protecting method comprising steps of:
    confirming that a crack incidence rate of a metallic solder material in a printed circuit board is high; and
    activating a protecting mechanism, wherein when an operating temperature of the solid state device reaches a first operating temperature, the controller controls the solid state device to enter and leave an idle mode multiple times and controls a time length in the idle mode, so that the operating temperature of the solid state device is decreased at a first average drop rate.

10. The protecting method as claimed in claim 9, further comprising steps of:
    if a temperature difference between a highest operating temperature and a lowest operating temperature of the solid state device exceeds a predetermined temperature difference, increasing a count value by 1;
    if the temperature difference between the highest operating temperature and the lowest operating temperature of the solid state device does not exceed the predetermined temperature difference, keeping the count value unchanged; and when the count value reaches a predetermined count value, confirming that the crack incidence rate of the metallic solder material in the printed circuit board is high.

* * * * *